(12) United States Patent
Kim et al.

(10) Patent No.: US 11,798,449 B2
(45) Date of Patent: Oct. 24, 2023

(54) DISPLAY DEVICE

(71) Applicant: Samsung Display Co., LTD., Yongin-si (KR)

(72) Inventors: Sun Ho Kim, Seongnam-si (KR); Chea Eun Kim, Seoul (KR); Hye Won Kim, Seoul (KR); Ju Chan Park, Seoul (KR); Sun Hee Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 17/487,475

(22) Filed: Sep. 28, 2021

(65) Prior Publication Data
US 2022/0189358 A1 Jun. 16, 2022

(30) Foreign Application Priority Data
Dec. 11, 2020 (KR) .......................... 10-2020-0173391

(51) Int. Cl.
| | |
|---|---|
| *G09G 3/00* | (2006.01) |
| *G09G 3/20* | (2006.01) |
| *H10K 50/844* | (2023.01) |
| *H10K 59/121* | (2023.01) |
| *H10K 77/10* | (2023.01) |
| *H10K 102/00* | (2023.01) |

(52) U.S. Cl.
CPC ................. *G09G 3/03* (2020.08); *G09G 3/20* (2013.01); *H10K 50/844* (2023.02); *H10K 59/121* (2023.02); *H10K 77/111* (2023.02); *G09G 2300/0426* (2013.01); *G09G 2310/0267* (2013.01); *G09G 2310/0275* (2013.01); *H10K 2102/311* (2023.02)

(58) Field of Classification Search
CPC ............ G09G 3/035; G09G 3/20; G09G 5/00; G09G 2300/0426; G09G 2360/04; G09G 2300/023; G09G 3/00
See application file for complete search history.

(56) References Cited

U.S. PATENT DOCUMENTS

| | | | | |
|---|---|---|---|---|
| 9,588,388 B2* | 3/2017 | Ahn | .................. | G02F 1/133512 |
| 10,032,839 B2* | 7/2018 | Kang | .................... | G09G 3/3233 |
| 10,497,305 B2* | 12/2019 | Ahn | .................. | G02F 1/133512 |
| 10,712,862 B1* | 7/2020 | Kang | .................... | G06F 1/1643 |
| 11,485,114 B2* | 11/2022 | Ahn | ........................ | G06F 3/041 |

(Continued)

FOREIGN PATENT DOCUMENTS

| | | |
|---|---|---|
| KR | 10-0706722 | 4/2007 |
| KR | 10-2017-0016557 | 2/2017 |

(Continued)

*Primary Examiner* — Olga V Merkoulova
(74) *Attorney, Agent, or Firm* — KILE PARK REED & HOUTTEMAN PLLC

(57) ABSTRACT

A display device includes a substrate including a first display area, a second display area, and a non-display area; a first pixel circuit part and a second pixel circuit part disposed in the first display area; a 1-1-th light-emitting element electrically connected to the first pixel circuit part and overlapping the first display area; and a second light-emitting element electrically connected to the second pixel circuit part and overlapping the second display area. The non-display area is disposed between the first display area and the second display area.

18 Claims, 15 Drawing Sheets

(56) References Cited

U.S. PATENT DOCUMENTS

| | | | |
|---|---|---|---|
| 11,662,780 B2* | 5/2023 | Park | G06F 1/1652 |
| | | | 361/679.01 |
| 2007/0035473 A1* | 2/2007 | Yamazaki | G02F 1/13318 |
| | | | 345/4 |
| 2014/0049449 A1* | 2/2014 | Park | G09G 3/035 |
| | | | 29/841 |
| 2014/0118654 A1* | 5/2014 | Ahn | G09G 3/20 |
| | | | 29/846 |
| 2015/0382446 A1* | 12/2015 | Kwon | G06F 1/1643 |
| | | | 174/251 |
| 2016/0313769 A1* | 10/2016 | Yoshitani | G06F 1/1635 |
| 2017/0025070 A1* | 1/2017 | Kang | H01L 27/3276 |
| 2017/0124945 A1* | 5/2017 | Ahn | G09G 3/3225 |
| 2017/0263690 A1* | 9/2017 | Lee | G02F 1/133305 |
| 2020/0203458 A1* | 6/2020 | Jin | H01L 25/048 |
| 2020/0264671 A1* | 8/2020 | Yoshitani | G06F 3/0446 |
| 2020/0302840 A1* | 9/2020 | Kim | G09G 3/006 |

FOREIGN PATENT DOCUMENTS

| | | |
|---|---|---|
| KR | 10-2017-0071047 | 6/2017 |
| KR | 10-2018-0018960 | 2/2018 |
| KR | 10-2076838 | 2/2020 |
| KR | 10-2097150 | 4/2020 |
| KR | 10-2020-0083021 | 7/2020 |

* cited by examiner

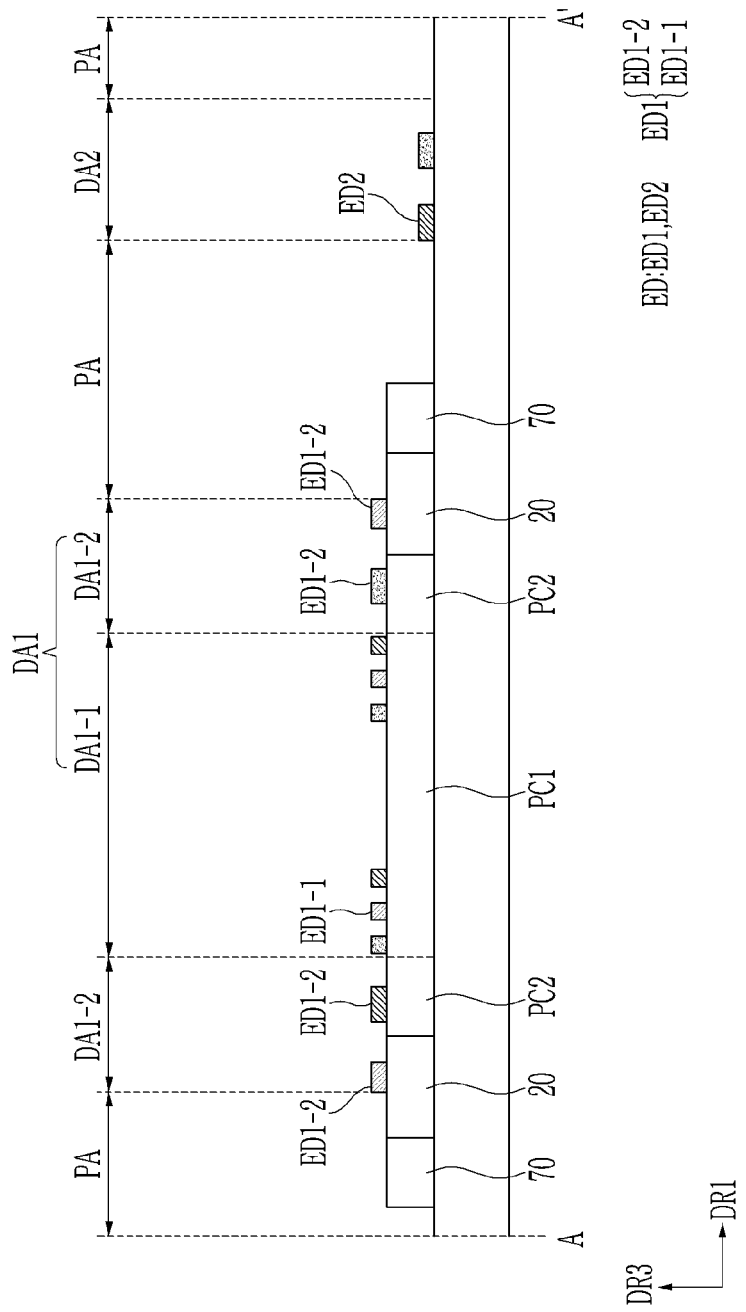

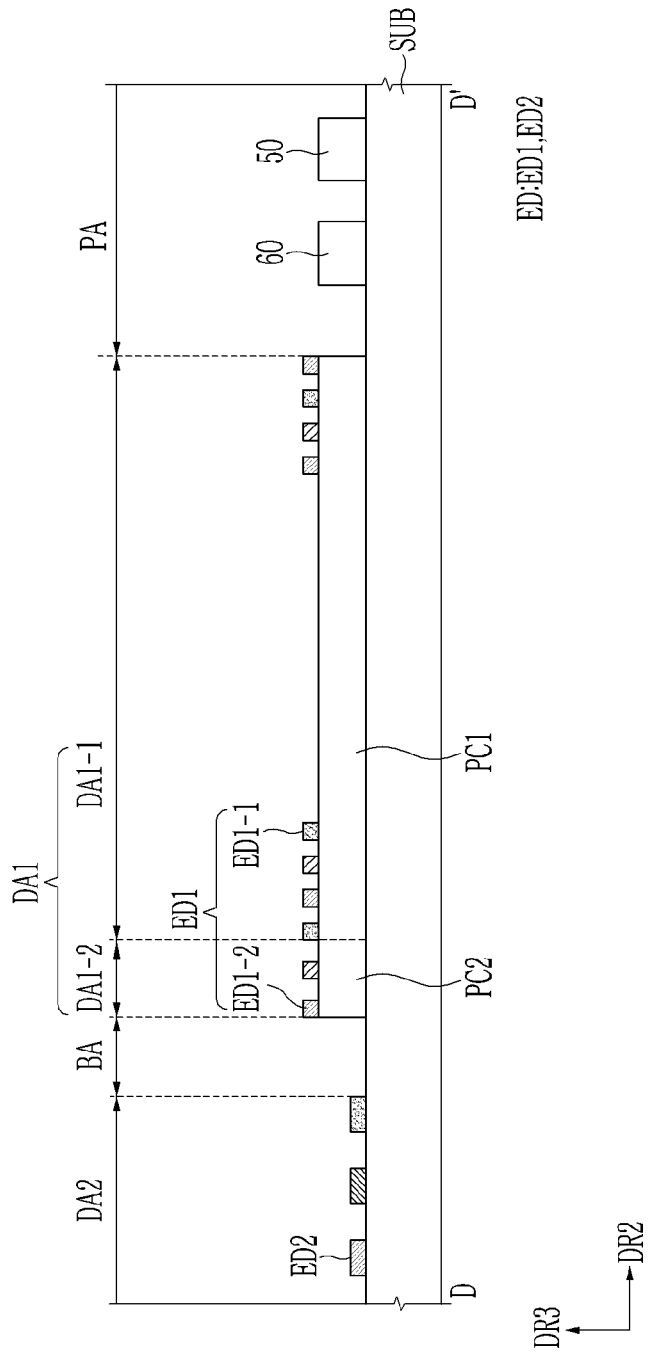

DISPLAY DEVICE

CROSS-REFERENCE TO RELATED APPLICATION

This application claims priority to and the benefit of Korean Patent Application No. 10-2020-0173391 filed in the Korean Intellectual Property Office (KIPO) on Dec. 11, 2020, the entire contents of which are incorporated herein by reference.

BACKGROUND

1. Technical Field

The disclosure relates to a display device.

2. Description of the Related Art

A display device is a device that visually displays data. Such a display device includes a substrate partitioned into a display area and a non-display area. In the display area, a scan line and a data line are insulated from each other and disposed, and pixels are included. In addition, a transistor and a first electrode that is electrically connected to the transistor are disposed corresponding to each of the pixels in the display area. In the display area, a second electrode that is commonly provided for the pixels may be disposed. In the non-display area, various wires, scan drivers, data drivers, controllers, etc. that transmit electrical signals to the display area may be provided.

These display devices are diversified in use. Accordingly, the design of the peripheral area of the display device is diversifying.

The above information disclosed in this Background section is only for enhancement of understanding of the background of the invention, and therefore it may contain information that does not form the prior art that is already known in this country to a person of ordinary skill in the art.

SUMMARY

Embodiments are to provide a display device having an extended display area.

A display device according to an embodiment may include a substrate including a first display area, a second display area, and a non-display area; a first pixel circuit part and a second pixel circuit part disposed in the first display area; a 1-1-th light-emitting element electrically connected to the first pixel circuit part and overlapping the first display area; and a second light-emitting element electrically connected to the second pixel circuit part and overlapping the second display area. The first display area and the second display area may be spaced apart via the non-display area.

The non-display area between the first display area and the second display area may be a bending area.

The first display area may include a 1-1-th display area and a 1-2-th display area, and the first pixel circuit part and the 1-1-th light-emitting element may be disposed in the 1-1-th display area.

The display device may include a 1-2-th light-emitting element disposed in the 1-2-th display area, and at least part of the 1-2-th display area may overlap a scan driver.

The 1-1-th light-emitting element may be electrically connected to the first pixel circuit part, and the 1-2-th light-emitting element may be electrically connected to the second pixel circuit part.

The second light-emitting element may include a first electrode; an emission layer disposed on the first electrode; and a second electrode disposed on the emission layer. The first electrode may be electrically connected to the second pixel circuit part, and the first electrode may be bent in the bending area.

The display device may include a first encapsulation layer disposed on the first light-emitting element and a second encapsulation layer disposed on the second light-emitting element, and the first encapsulation layer and the second encapsulation layer may be spaced apart.

The display device may include a scan line extending in a first direction, and the first display area and the second display area may be spaced apart in the first direction.

The display device may include a data line extending in a second direction, and the first display area and the second display area may be spaced apart in the second direction.

The display device may include a data driver disposed in the non-display area, and the first display area, the second display area, and the data driver may be disposed in the second direction.

The display device may include a data driver disposed in the non-display area, and the second display area, the first display area, and the data driver are disposed in the second direction.

The first display area may be disposed on a front of the display device, and the second display area is disposed on a rear of the display device.

A display device according to an embodiment may include a substrate including a first display area, a second display area, and a bending area between the first display area and the second display area; a first pixel circuit part and a second pixel circuit part disposed on the first display area; a 1-1-th light-emitting element electrically connected to the first pixel circuit part and overlapping the first display area; and a second light-emitting element electrically connected to the second pixel circuit part and overlapping the second display area. The first display area may be disposed on a front of the display device, and the second display area is disposed on a rear of the display device.

The first display area may include a 1-1-th display area and a 1-2-th display area, the 1-1-th light-emitting element may be disposed in the 1-1-th display area, and the display device may further include a 1-2-th light-emitting element disposed in the 1-2-th display area.

The display device may include a scan driver overlapping at least a part of the 1-2-th display area.

The 1-2-th light-emitting element may overlap the second pixel circuit part.

The second light-emitting element may include a first electrode, an emission layer overlapping the first electrode, and a second electrode overlapping the emission layer, and the first electrode may be electrically connected to the second pixel circuit part and may intersect the bending area.

The display device may include a first encapsulation layer overlapping the first light-emitting element, and a second encapsulation layer overlapping the second light-emitting element, and the first encapsulation layer and the second encapsulation layer may be spaced apart.

The display device may include a scan line extending in a first direction, and the first display area and the second display area may be spaced apart in the first direction.

The display device may include a data line extending in a second direction, and the first display area and the second display area may be spaced apart in the second direction.

According to an embodiment, the display device having the extended display area may be provided.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 2B is a schematic cross-sectional view taken along a line A-A' of FIG. 2A.

FIG. 8B is a schematic cross-sectional view taken along a line D-D' of FIG. 8A.

DETAILED DESCRIPTION OF THE EMBODIMENTS

Figure 1A:
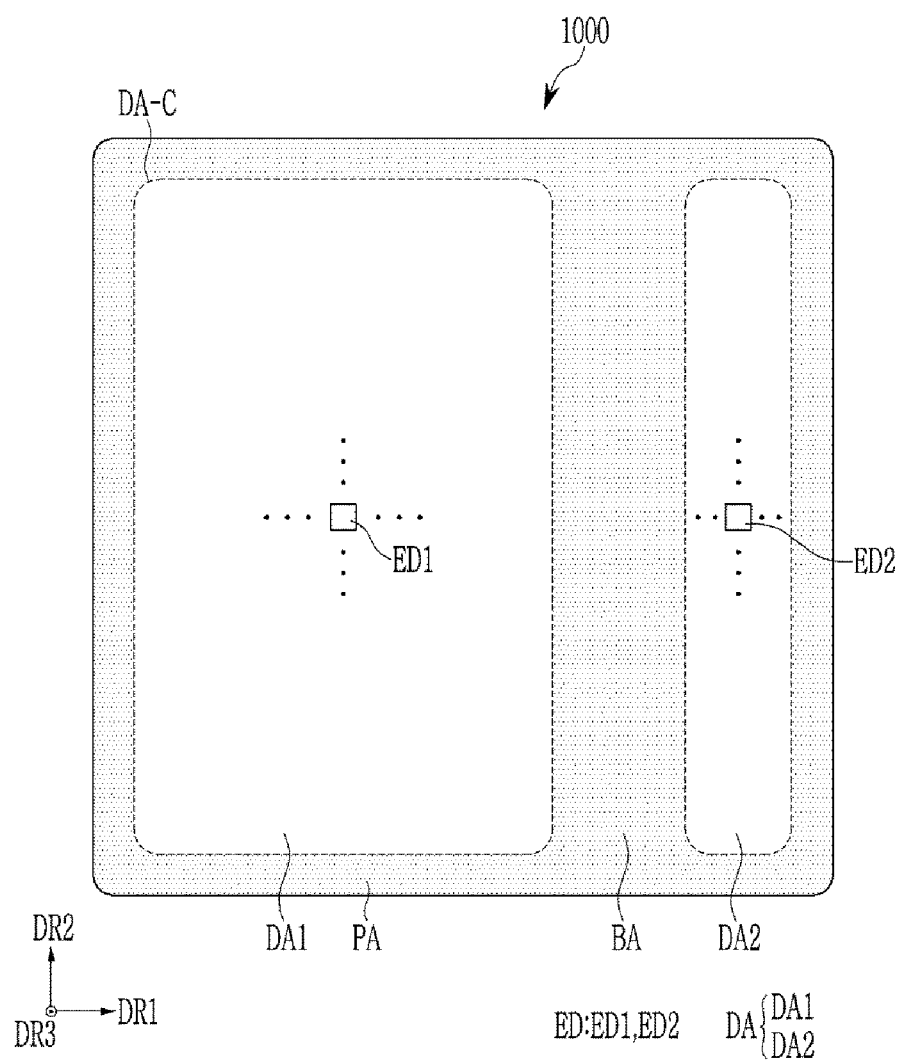
FIG. 1A is a schematic plan view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

The drawings and description are to be regarded as illustrative in nature and not restrictive. Like reference numerals denote like elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thickness of layers, films, panels, areas, etc., may be exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. In addition, the word "on" may mean positioning on or below the object portion but does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "on a flat surface," "a planar shape," or "in a plan view" means when an object portion is viewed from above, and the phrase "on a cross-section" or "in a cross-sectional view" means when a cross-section taken by vertically cutting an object portion is viewed from the side.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
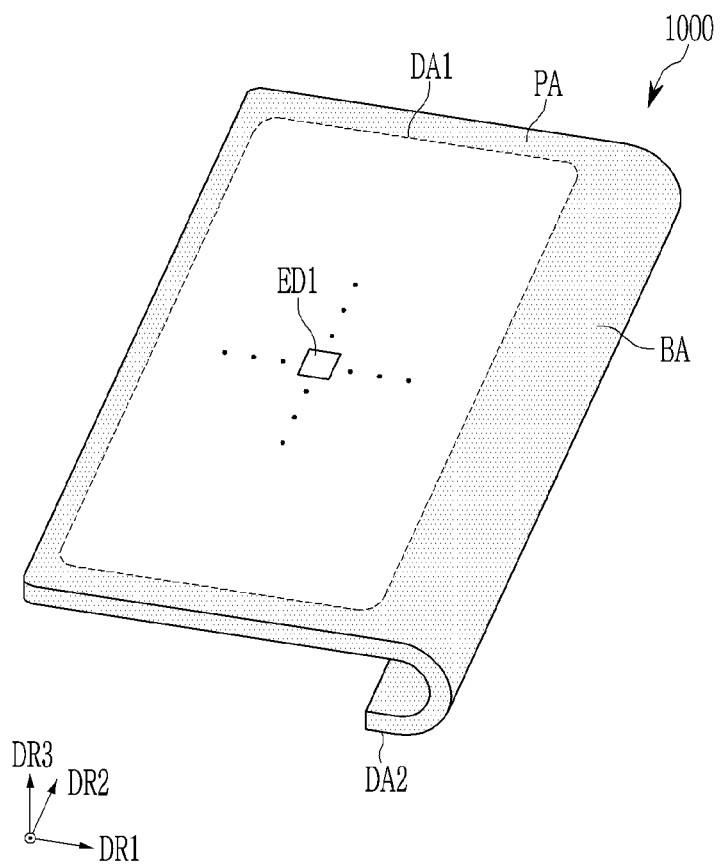
FIG. 1B is a schematic perspective view of a display device according to an embodiment.

FIG. 1A is a schematic plan view of a display device according to an embodiment, and FIG. 1B is a schematic perspective view of a display device according to an embodiment.

Referring to FIGS. 1A and 1B, a display device 1000 according to an embodiment includes a display area DA in which light-emitting elements ED1 and ED2 are disposed and an image is displayed, and a non-display area PA around or adjacent to the display area DA.

The display area DA may have a rectangular shape, for example. Each edge DA-C of the display area DA may have a rounded shape. The non-display area PA may have a shape surrounding the display area DA. However, the disclosure is not limited thereto, and the shapes of the display area DA and the non-display area PA may be relatively designed.

The display area DA may include a first display area DA1 and a second display area DA2 adjacent to the first display area DA1 and be spaced apart from each other with the non-display area PA interposed therebetween. The second display area DA2 is shown to be positioned (or disposed) on the right side of the first display area DA1 in an embodiment, but it is not limited thereto and may be positioned on the left side of the first display area DA1 or on both sides of the left and right sides thereof. The area of the second display area DA2 may be smaller than that of the first display area DA1, but the disclosure is not limited thereto.

The first light-emitting element ED1 may be positioned in the first display area DA1, and the second light-emitting element ED2 may be positioned in the second display area DA2. The drawings illustrate the first light-emitting element ED1 and the second light-emitting element ED2 in a square shape, but this is for expressing a light-emitting element, and the actual planar shape thereof may be a polygonal shape, but the disclosure is not limited thereto.

The non-display area PA is an area in which the image is not displayed. The non-display area PA is an area other than the display area DA in the display device 1000. In particular, the non-display area PA positioned between the first display area DA1 and the second display area DA2 may be a bending area BA where a substrate is bent.

A surface of the display device 1000 on which the image is displayed is parallel to a plane defined by a first direction DR1 and a second direction DR2. The normal direction of the surface on which the image is displayed, for example, the thickness direction of the display device 1000, indicates a third direction DR3. The front (or top) and the back (or bottom) of each member are separated by the third direction DR3. However, the directions indicated by the first to third directions DR1, DR2, and DR3 are relative concepts and may be changed to other directions.

The display device 1000, as shown in FIG. 1B, may be out-folded based on the bending axis parallel to the second direction DR2. As the display device 1000 according to an embodiment is out-folded based on a bending axis parallel to the second direction DR2, both the first display area DA1 and the second display area DA2 may be exposed to the outside. The first display area DA1 may be positioned on the front of the display device 1000, and the second display area DA2 may be positioned on the rear of the display device 1000. The display device 1000 according to an embodiment may display the image on both the front and rear surfaces thereof.

Figure 2A:
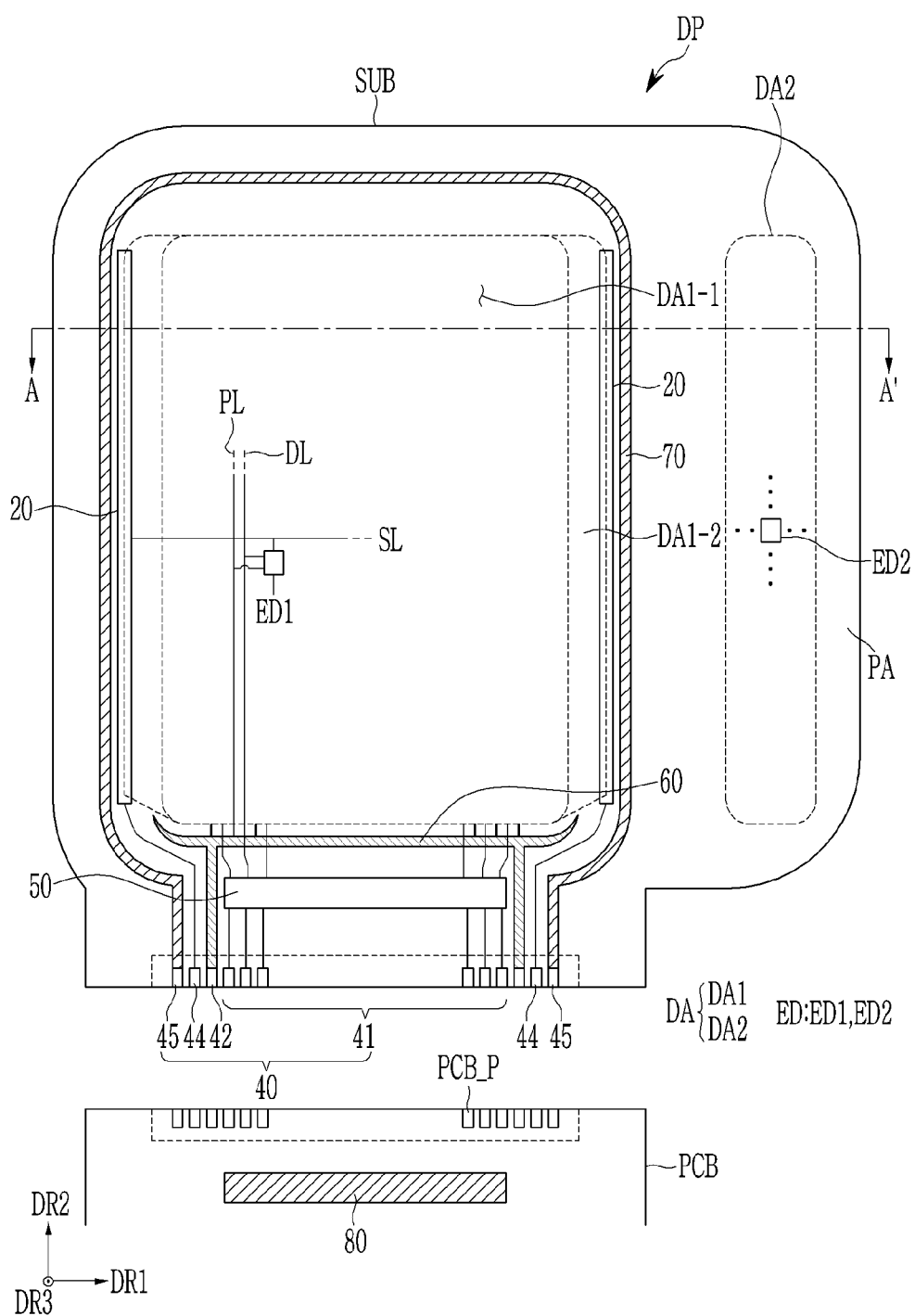
FIG. 2A is a schematic plan view of a display panel according to an embodiment.

FIG. 2A is a schematic top plan view of a display panel according to an embodiment, and FIG. 2B is a schematic cross-sectional view taken along line A-A' of FIG. 2A.

Referring to FIGS. 2A and 2B, a display panel DP includes a display area DA and a non-display area PA corresponding to those of the display device 1000 described in FIGS. 1A and 1B. The non-display area PA may be defined along the border of the display area DA.

The display area DA includes light-emitting elements ED1 and ED2 electrically connected to signal lines. Each light-emitting element ED1 and ED2 may emit red, green, blue light, or white light. The display area DA provides an image by the light emitted by the light-emitting elements ED1 and ED2. The display area DA is defined by the light-emitting elements ED1 and ED2. In this specification, the non-display area PA indicates an area in which no image is provided, and indicates an area where no light-emitting element is disposed.

The display area DA according to an embodiment includes a first display area DA1 and a second display area DA2. The first display area DA1 is an area where light is emitted by the first light-emitting element ED1, and the second display area DA2 is an area where light is emitted by the second light-emitting element ED2. The non-display area PA corresponds to the outer areas of the first display area DA1 and the second display area DA2.

The display device according to an embodiment includes a first pixel circuit part PC1 and a second pixel circuit part PC2 disposed on a substrate SUB. Referring to FIG. 2B, the first pixel circuit part PC1 represents an area in which first pixel circuit parts PC1 are substantially arranged in matrix form, and the second pixel circuit part PC2 is an area in which second pixel circuit parts PC2 are substantially arranged in a matrix form. The area occupied by first pixel circuit parts PC1 may be greater than the area occupied by second pixel circuit parts PC2. Each of the first and second pixel circuit parts PC1 and PC2 may be electrically connected to one of the light-emitting elements ED1 and ED2. The arrangement of pixel circuit parts is not particularly limited and may be arranged in various forms. For example, pixel circuit parts may not be orthogonal to each other and may cross each other in an inclined direction.

The areas of a first pixel circuit part PC1 and a second pixel circuit part PC2 may be different. For example, if the lengths of the first pixel circuit part PC1 and the second pixel circuit part PC2 are the same, the widths of the first pixel circuit part PC1 and the second pixel circuit part PC2 may be different. As another example, if the widths of the first pixel circuit part PC1 and the second pixel circuit part PC2 are the same, the lengths of the first pixel circuit part PC1 and the second pixel circuit part PC2 may be different.

A driving circuit part may include a driving part and signal wires positioned adjacent to the second pixel circuit part PC2. For example, the driving circuit part may include a scan driver 20, a data driver 50, a driving voltage supply line 60, a common voltage supply line 70, and signal transmission wires electrically connected to these.

The scan driver 20 generates and transmits scan signals to the first and second pixel circuit parts PC1 and PC2, which are electrically connected to the light-emitting elements ED1 and ED2 through a scan line SL. According to an embodiment, the scan driver 20 may be disposed on the left and right sides of the first display area DAL The drawings illustrate a structure in which the scan driver 20 is disposed on both sides of the substrate SUB, but in another embodiment, the scan driver 20 may be disposed only on a side of the substrate SUB.

A pad part 40 is disposed on an end of the display panel DP and includes terminals 41, 42, 44, and 45. The pad part 40 is exposed without being covered by an insulating layer and may be electrically connected to a printed circuit board PCB. The pad part 40 may be electrically connected to a pad part PCB_P of the printed circuit board PCB. The printed circuit board PCB may transmit the signal or power of an integrated circuit (IC) driving chip 80 to the pad part 40.

A controller converts image signals transmitted from the outside into image data signals and transmits the changed signals to the data driver 50 through the terminal 41. The controller may receive a vertical synchronization signal, a horizontal synchronizing signal, and a clock signal and generate a control signal for controlling the driving of the scan driver 20 and the data driver 50 to be transmitted to each of the terminals 44 and 41. The controller transmits a driving voltage ELVDD to the driving voltage supply line 60 through the terminal 42. The controller transmits a common voltage ELVSS to each of the common voltage supply lines 70 through the terminal 45.

The data driver 50 is disposed on the non-display area PA, generates the data signal, and transmits the same to the first and second pixel circuit parts PC1 and PC2 respectively and electrically connected to the light-emitting elements ED1 and ED2 through a data line DL. The data driver 50 may be disposed on a side of the display panel DP and may be disposed between, for example, the pad part 40 and the display area DA.

The driving voltage supply line 60 is disposed on the non-display area PA. For example, the driving voltage supply line 60 may be disposed between the data driver 50 and the display area DA. The driving voltage supply line 60 provides the driving voltage ELVDD to the first and second pixel circuit parts PC1 and PC2 electrically connected to the light-emitting elements ED1 and ED2, respectively. The driving voltage supply line 60 is disposed in the first direction DR1 and may be electrically connected to driving voltage lines PL disposed in the second direction DR2.

The common voltage supply line 70 is disposed on the non-display area PA. The common voltage supply line 70 may have a shape surrounding the substrate SUB. The common voltage supply line 70 may transmit the common voltage ELVSS to an electrode (e.g., a second electrode) of each light-emitting element ED1 and ED2. Although not shown in the drawings, a dam positioned in the non-display area PA may be further included.

The first light-emitting element ED1 may be positioned on at least parts of the first pixel circuit part PC1, the second pixel circuit part PC2, and the driving circuit part. The first light-emitting element ED1 may include a 1-1-th light-emitting element ED1-1 and a 1-2-th light-emitting element ED1-2.

The first pixel circuit part PC1 is electrically connected to the 1-1-th light-emitting element ED1-1 disposed above the first pixel circuit part PC1. The first pixel circuit part PC1 and the 1-1-th light-emitting element ED1-1 may be positioned in a 1-1-th display area DA1-1. The area where light is emitted by the 1-1-th light-emitting element ED1-1 is the 1-1-th display area DA1-1.

The second pixel circuit part PC2 is electrically connected to the 1-2-th light-emitting element ED1-2. The area where light is emitted by the 1-2-th light-emitting element ED1-2 is the 1-2-th display area DA1-2.

A part of the 1-2-th light-emitting element ED1-2 disposed on the second pixel circuit part PC2 may be positioned in a 1-2-th display area DA1-2. The 1-2-th light-emitting element ED1-2 electrically connected to the second pixel circuit part PC2 and disposed on the scan driver 20 may be positioned in the 1-2-th display area DA1-2.

Regarding the first and second pixel circuit parts PC1 and PC2, the scan driver 20, and the common voltage supply line 70, which are positioned between a side of the light-emitting element ED1 and the substrate SUB, the 1-2-th display area DA1-2 of the extended area may be provided by including the 1-2-th light-emitting element ED1-2 positioned on the scan driver 20 even though the area overlaps the scan driver 20 in addition to the first and second pixel circuit parts PC1 and PC2.

The display device according to an embodiment may further include a second display area DA2 positioned adjacent to the non-display area PA positioned outside the 1-2-th display area DA1-2. The second light-emitting element ED2 electrically connected to the second pixel circuit part PC2 may be positioned in the second display area DA2. The area where light is emitted by the second light-emitting element ED2 is the second display area DA2. The pixel circuit part that is electrically connected to the second light-emitting element ED2 is not positioned in the second display area DA2. The second pixel circuit part PC2 electrically connected to the second light-emitting element ED2 may be positioned in the first display area DA1. The second light-emitting element ED2 may have a shape in which the first electrode is extended, and thus may be electrically connected to the second pixel circuit part PC2 positioned in the first display area DA1. The specific structure thereof is described below.

The drawings illustrate an embodiment in which the second light-emitting element ED2 is positioned on the substrate SUB, but this is a schematic view, and an insulating layer may be positioned between the second light-emitting element ED2 and the substrate SUB.

Figure 2C:
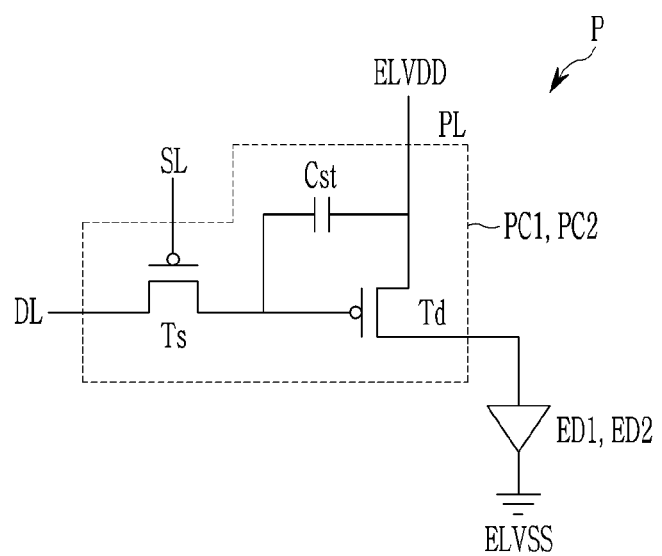
FIG. 2C is a schematic circuit diagram of a pixel circuit part according to an embodiment.

Referring to FIG. 2C, a pixel P may include first and second pixel circuit parts PC1 and PC2 and light-emitting elements ED1 and ED2 electrically connected thereto. Each of the first pixel circuit part PC1 and the second pixel circuit part PC2 includes a driving thin-film transistor Td, a switching thin-film transistor Ts, and a storage capacitor Cst.

The switching thin-film transistor Ts is electrically connected to the scan line SL and the data line DL and transmits the data signal input through the data line DL to the driving thin-film transistor Td in response to the scan signal input through the scan line SL.

The storage capacitor Cst is electrically connected to the switching thin-film transistor Ts and the driving voltage line PL and stores the voltage corresponding to the difference between the voltage transmitted from the switching thin-film transistor Ts and the driving voltage ELVDD supplied to the driving voltage line PL.

The driving thin-film transistor Td is electrically connected to the driving voltage line PL and the storage capacitor Cst and may control the driving current flowing to the light-emitting element ED from the driving voltage line PL by corresponding to the voltage value stored in the storage capacitor Cst. The light-emitting elements ED1 and ED2 may emit light with a predetermined luminance by the driving current.

Figure 3:
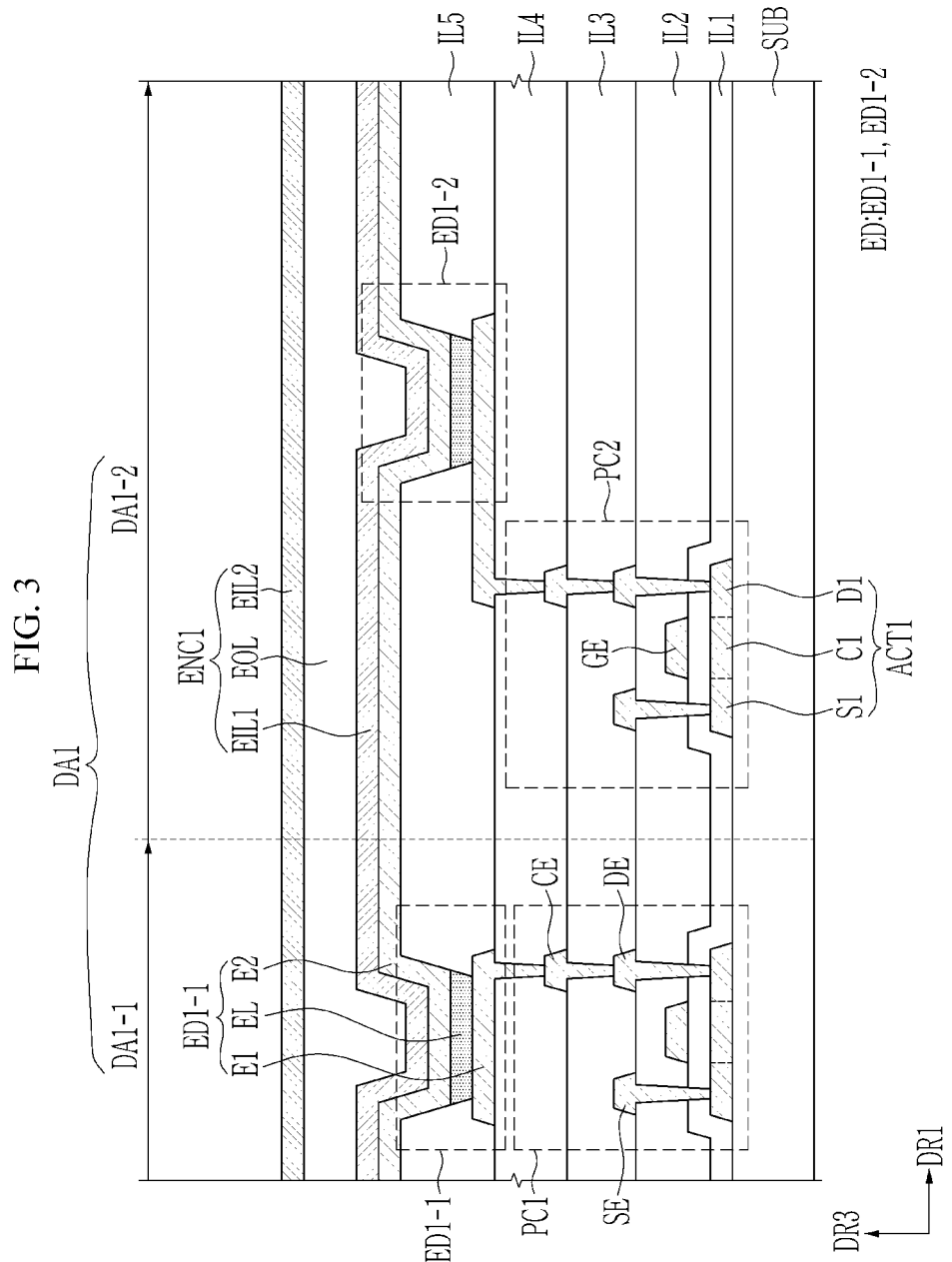
FIG. 3 is a schematic cross-sectional view of a first display area according to an embodiment.
Figure 4:
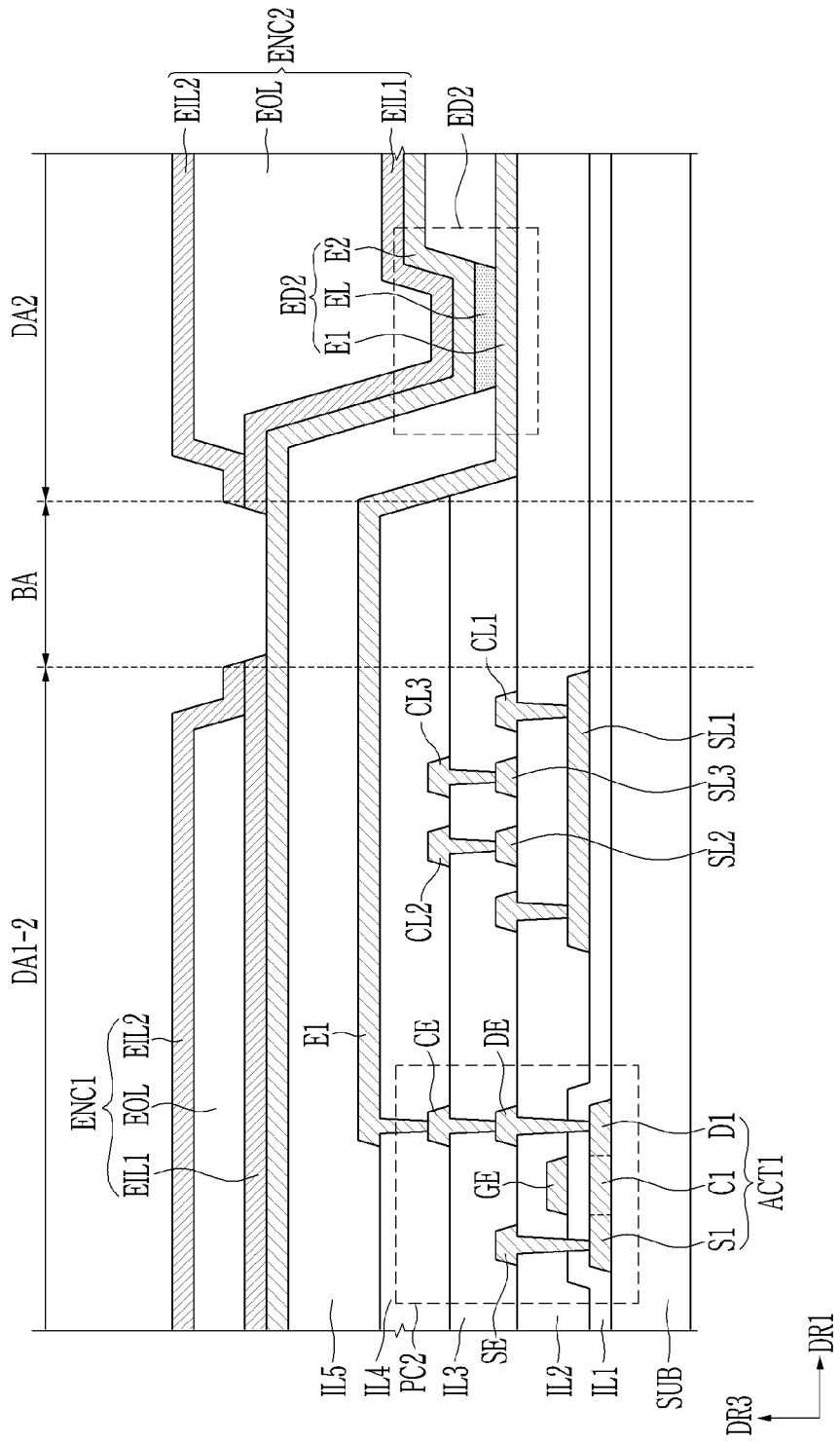
FIG. 4 is a schematic cross-sectional view of a part of a first display area, a bending area, and a second display area according to an embodiment.

The specific stacked structure is described with reference to FIGS. 3 and 4 in addition to the above-described drawings. FIG. 3 is a schematic cross-sectional view of a first display area according to an embodiment, and FIG. 4 is a schematic cross-sectional view of parts of a first display area, a bending area, and a second display area according to an embodiment. A description of the same configurations of the above-described elements is omitted.

The first pixel circuit part PC1 and the 1-1-th light-emitting element ED1-1 disposed in the 1-1-th display area DA1-1 are described with reference to FIG. 3.

The first pixel circuit part PC1 includes a semiconductor layer ACT1 positioned on the substrate SUB.

The substrate SUB may include a material such as glass, metal, or an organic material containing $SiO_2$ as a main component. According to an embodiment, the substrate SUB may include a flexible material. For example, the substrate SUB may include a flexible plastic material such as polyimide, but the disclosure is not limited thereto. In an embodiment, the plastic material may include polyethersulphone (PES), polyacrylate (PAR,), polyether imide (PEI), polyethylene naphthalate (PEN), polyethyeleneterepthalate (PET), polyphenylene sulfide (PPS), polyallylate, polyimide, polycarbonate (PC), cellulose triacetate (TAC), cellulose acetate propionate (CAP), a cyclic olefin polymer, a cyclic olefin copolymer, or the like.

The semiconductor layer ACT1 may include at least one of polysilicon and an oxide semiconductor. The semiconductor layer ACT1 includes a channel area C1, a source area 51, and a drain area D1. The source area 51 and the drain area D1 are disposed on both sides of the channel area C1, respectively. The channel area C1 may include a semiconductor which is hardly doped with an impurity, and the source area S1 and the drain area D1 may include a semiconductor doped with a conductive impurity. The semiconductor layer ACT1 may be made of an oxide semiconductor, and in this case, a separate protective layer (not shown) may be added to protect an oxide semiconductor material that is vulnerable to external environments such as high temperature.

A gate insulating layer IL1 is positioned on the semiconductor layer ACT1. The gate insulating layer IL1 may be a single layer or multi-layer including at least one of a silicon nitride ($SiN_x$) and silicon dioxide ($SiO_2$). The drawings illustrate an embodiment in which the gate insulating layer IL1 is formed over the entire substrate SUB, but the disclosure is not limited thereto, and the gate insulating layer IL1 may overlap only the channel area C1.

A gate electrode GE is positioned on the gate insulating layer IL1 overlapping the channel area C1, and the gate electrode GE may be a single layer or a multi-layer in which a metal film including at least one of copper (Cu), a copper alloy, aluminum (Al), an aluminum alloy, molybdenum (Mo), and a molybdenum alloy.

An interlayer insulating layer IL2 is positioned on the gate electrode GE and the gate insulating layer ILL The interlayer insulating layer IL2 may include an inorganic material including a silicon oxide ($SiO_x$), a silicon nitride ($SiN_x$), and a silicon oxynitride ($SiO_xN_y$), or may include an organic material. The interlayer insulating layer IL2 may have a single layer or multi-layer structure.

The source electrode SE and the drain electrode DE are positioned on the interlayer insulating layer IL2. The source electrode SE and the drain electrode DE are electrically connected to the source area S1 and the drain area D1 of the semiconductor layer ACT1, respectively, through contact holes formed in the interlayer insulating layer IL2.

The source electrode SE and the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), tantalum (Ta), titanium (Ti), tungsten (W), and/or copper (Cu), etc., and may be a single layer or a multi-layer structure including the same. For example, the source electrode SE and the drain electrode DE may have a triple-layer structure of a lower layer including refractory metals such as molybdenum, chromium, tantalum, and titanium, or their alloys, an intermediate layer including aluminum-based metals, silver-based metals, and copper-based materials with a low resistivity, and an upper layer including a refractory metal such as molybdenum, chromium, tantalum, and titanium.

A first insulating layer IL3 is positioned on the source electrode SE and the drain electrode DE. The first insulating layer IL3 may be positioned so as to overlap the entire surface of the substrate SUB. The first insulating layer IL3 may include an inorganic material such as a silicon nitride ($SiN_x$) or silicon dioxide ($SiO_2$), or an organic material.

A connection electrode CE is disposed on the first insulating layer IL3. The connection electrode CE may be electrically connected to the drain electrode DE through a contact hole of the first insulating layer IL3. The drawings illustrate a configuration in which the drain electrode DE and the first electrode E1 are electrically connected to each other by the connection electrode CE, but the disclosure is not limited thereto, and it goes without saying that the drain electrode DE and the first electrode E1 may be directly connected.

A second insulating layer IL4 is disposed on the connection electrode CE. The second insulating layer IL4 may include an organic material such as a generally-used polymer such as poly(methyl methacrylate) (PMMA) or polystyrene (PS), a polymer derivative having a phenol-based group, an acryl-based polymer, an imide-based polymer, polyimide, an acryl-based polymer, and a siloxane-based polymer, or a stacked layer of an organic material and an inorganic material, or an inorganic layer.

A first electrode E1 is positioned on the second insulating layer IL4. The first electrode E1 is electrically connected to the connection electrode CE through a contact hole of the second insulating layer IL4 and then is electrically connected to the drain electrode DE.

A transistor including the gate electrode GE, the semiconductor layer ACT1, the source electrode SE, and the drain electrode DE is electrically connected to the first electrode E1 to supply the current to the light-emitting element ED1.

A partition wall IL5 is positioned on the second insulating layer IL4 and the first electrode E1. The partition wall IL5 overlaps at least a part of the first electrode E1 and has an opening defining a luminous area. The opening may have a planar shape almost similar to that of the first electrode E1. The opening may have a rhombic shape or an octagonal shape similar to a rhombus in a plan view, but the disclosure is not limited thereto, and the opening may have a shape such as a quadrangle or polygon.

The partition wall IL5 may include an organic material such as a generally-used polymer such as poly(methyl methacrylate) (PMMA) or polystyrene (PS), a polymer derivative having a phenol-based group, an acryl-based polymer, an imide-based polymer, polyimide, an acryl-based polymer, and a siloxane-based polymer, or a silica-based inorganic material.

An emission layer EL is positioned on the first electrode E1 overlapping the opening. The emission layer EL may be made of a low-molecular organic material or a high-molecular organic material such as PEDOT (poly(3,4-ethylene-dioxythiophene)). The emission layer EL may be a multi-layer including at least one of a hole injection layer (HIL), a hole transporting layer (HTL), an electron transporting layer (ETL), and an electron injection layer (EIL).

Most of the emission layer EL may be positioned within the opening and may also be positioned on the partition wall IL5 or a side thereof.

A second electrode E2 is positioned on the emission layer EL. The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc., or a transparent conductive oxide (TCO) such as indium tin oxide (ITO) and indium zinc oxide (IZO).

The first electrode E1, the emission layer EL, and the second electrode E2 may form (or constitute) the 1-1-th light-emitting element ED1-1. Here, the first electrode E1 may be an anode, which is a hole injection electrode, and the second electrode E2 may be a cathode, which is an electron injection electrode. However, the embodiment is not limited thereto, and depending on the driving method of the emissive display device, the first electrode E1 may be a cathode, and the second electrode E2 may be an anode.

Holes and electrons are injected into the organic emission layer EL from the first electrode E1 and the second electrode E2, respectively, and light emission occurs in case that the exciton, in which the injected holes and electrons are combined, falls from an excited state to a ground state.

A first encapsulation layer ENC1 is positioned on the second electrode E2. The first encapsulation layer ENC1 may cover (or overlap) and seal the side as well as the upper surface of the first light-emitting element ED1. Since the light-emitting element is very vulnerable to moisture and oxygen, the first encapsulation layer ENC1 seals the first light-emitting element ED1 to block the inflow of moisture and oxygen from the outside.

The first encapsulation layer ENC1 may include layers and may be formed of a composite film including both an inorganic layer and an organic layer and, for example, may be formed in three layers, in which a first inorganic layer EIL1, an organic layer EOL, and a second inorganic layer EIL2 are formed sequentially.

The first inorganic layer EIL1 may cover the second electrode E2. The first inorganic layer EIL1 may prevent the penetration of external moisture or oxygen into the light-emitting element ED. For example, the first inorganic layer EIL1 may include a silicon nitride, a silicon oxide, or a combination compound thereof. The first inorganic layer EIL1 may be formed by a deposition process.

The organic layer EOL may be disposed on the first inorganic layer EIL1 so that it may contact the first inorganic layer HU. A curvature formed on the upper surface of the first inorganic layer EIL1 or particles present on the first inorganic layer EIL1 are covered (or overlapped) by the organic layer EOL, so that it is possible to prevent the surface state of the upper surface of the first inorganic layer EIL1 from affecting the elements formed on the organic layer EOL. The organic layer EOL may alleviate the stress between contacting layers. The organic layer EOL may include an organic material and may be formed by a solution process such as spin coating, slit coating, or an inkjet process.

The second inorganic layer EIL2 is disposed on the organic layer EOL to cover (or overlap) the organic layer EOL. The second inorganic layer EIL2 may be stably formed on a relatively flat surface rather than being disposed on the first inorganic layer EIL1. The second inorganic layer EIL2 may encapsulate moisture or the like discharged from the organic layer EOL to prevent the same from flowing to the outside. The second inorganic layer EIL2 may include a silicon nitride, a silicon oxide, or a combination thereof. The second inorganic layer EIL2 may be formed by a deposition process.

Although it is not shown in the drawings, a capping layer positioned between the second electrode E2 and the first encapsulation layer ENC1 may be further included. The capping layer may include an organic material. The capping layer protects the second electrode E2 from a subsequent process, for example, a sputtering process and improves light emission efficiency of the light-emitting element ED. The capping layer may have a refractive index greater than that of the first inorganic layer EIL1.

In FIG. 3, the elements positioned between the substrate SUB and the 1-1-th light-emitting element ED1-1 correspond to the first pixel circuit part PC1 described in FIG. 2B. The first pixel circuit part PC1 may be electrically connected to the 1-1-th light-emitting element ED1-1 positioned on the first pixel circuit part PC1.

The second pixel circuit part PC2 may be positioned outside the first pixel circuit part PC1. Since the stacked structure of the second pixel circuit part PC2 may be substantially identical or similar to that of the first pixel circuit part PC1, detailed descriptions thereof are omitted.

The first electrode E1 included in the second pixel circuit part PC2 may extend toward the edge of the substrate SUB. The first electrode E1 included in the 1-2-th light-emitting element ED1-2 may be positioned toward the edge of the substrate SUB compared to the second pixel circuit part PC2 electrically connected to the 1-2-th light-emitting element ED1-2 while being disposed outward in the first direction DR1. For example, the 1-2-th light-emitting element ED1-2 may be positioned outside the second pixel circuit part PC2 electrically connected to each 1-2-th light-emitting element ED1-2 in the first direction DR1. The 1-2-th light-emitting element ED1-2 according to an embodiment may be positioned to overlap the second pixel circuit part PC2 or may be positioned to overlap the scan driver 20.

Based on the layer on which the light-emitting element is positioned, the area where the 1-1-th light-emitting element ED1-1 is positioned is the 1-1-th display area DA1-1. Based on the layer on which the light-emitting element is positioned, the area where the 1-2-th light-emitting element ED1-2 is positioned is the 1-2-th display area DA1-2. While the 1-2-th display area DA1-2 emits light, a pixel circuit part such as the scan driver 20 may be positioned under the 1-2-th light-emitting element ED1-2. As the display area DA includes not only the 1-1-th display area DA1-1 but also the 1-2-th display area DA1-2, a more extended display area may be provided.

Referring to FIG. 4, the non-display area PA corresponding to the bending area BA and the second display area DA2 may be positioned outside the 1-2-th display area DA1-2.

The gate insulating layer IL1 and the interlayer insulating layer IL2 extending from the first display area DA1 may be positioned in the second display area DA2.

On the interlayer insulating layer IL2, the first electrode E1 electrically connected to the second pixel circuit part PC2 disposed in the 1-2-th display area DA1-2 and extending from the 1-2-th display area DA1-2 to the second display area DA2 while crossing the bending area BA may be positioned.

The drawings illustrate a structure in which the first insulating layer IL3 and the second insulating layer IL4 are removed from the second display area DA2, but the disclosure is not limited thereto, and the first insulating layer IL3 and the second insulating layer IL4 may be formed to extend independently to the second display area DA2.

The partition wall IL5 defining a light emitting area may be positioned on the first electrode E1 positioned in the second display area DA2. The partition wall IL5 may have an opening that overlaps a part of the first electrode E1 and defines the light emitting area.

The emission layer EL may be positioned within the opening of the partition wall IL5. Most of the emission layer EL may be positioned within the opening and may also be positioned on the partition wall IL5 or a side thereof.

The second electrode E2 extending from the first display area DA1 may be positioned on the partition wall IL5 and the emission layer EL. The first electrode E1, the emission layer EL, and the second electrode E2, which are disposed on the second display area DA2, may form the second light-emitting element ED2.

According to an embodiment, the area in which the second light-emitting element ED2 is positioned and the area in which the pixel circuit part electrically connected to the second light-emitting element ED2 is positioned may be separated. The area where the second light-emitting element ED2 is positioned may be freely designed. A separate transistor or driving chip may not be required to provide the second display area DA2.

A second encapsulation layer ENC2 is positioned on the second light-emitting element ED2. The second encapsulation layer ENC2 may have a structure in which the first inorganic layer HU, the organic layer EOL, and the second inorganic layer EIL2 are stacked. The first encapsulation layer ENC1 and the second encapsulation layer ENC2 may have the same stacked structure, but may be spaced apart from each other in the bending area BA. The drawings illustrate that the first encapsulation layer ENC1 and the second encapsulation layer ENC2 are completely separated from each other, but the disclosure is not limited thereto. For example, an embodiment in which the first inorganic layer EIL1 and the second inorganic layer EIL2 of each of the first and second encapsulation layers ENC1 and ENC2 are separated from each other and the organic layer EOL of each of the first and second encapsulation layers ENC1 and ENC2 is connected is also possible. The substrate SUB may be bent more readily by removing the inorganic layer that is disposed in the bending area BA.

According to an embodiment, the second display area DA2 may be positioned on the rear surface of the first display area DA1 by the bending of the bending area BA. The bending area BA between the first display area DA1 and the second display area DA2 is an area from which the first and second inorganic layers EIL1 and EIL2 have been removed. The display device may be bent in a state in which the first and second inorganic layers EIL1 and EIL2, in which cracks due to bending may occur, are removed. Since the display device is readily bent and the second display area DA2 positioned on the rear surface of the first display area DA1 may be provided through the pixel circuit part positioned on the first display area DA1, the rear of the display device may be readily implemented.

The scan driver 20 or the like overlapping the 1-2-th display area DA1-2 may have signal lines SL1, SL2, and SL3 and connection wirings CL1, CL2, and CL3 electrically connected to each other, but the disclosure is not limited thereto.

Figure 5A:
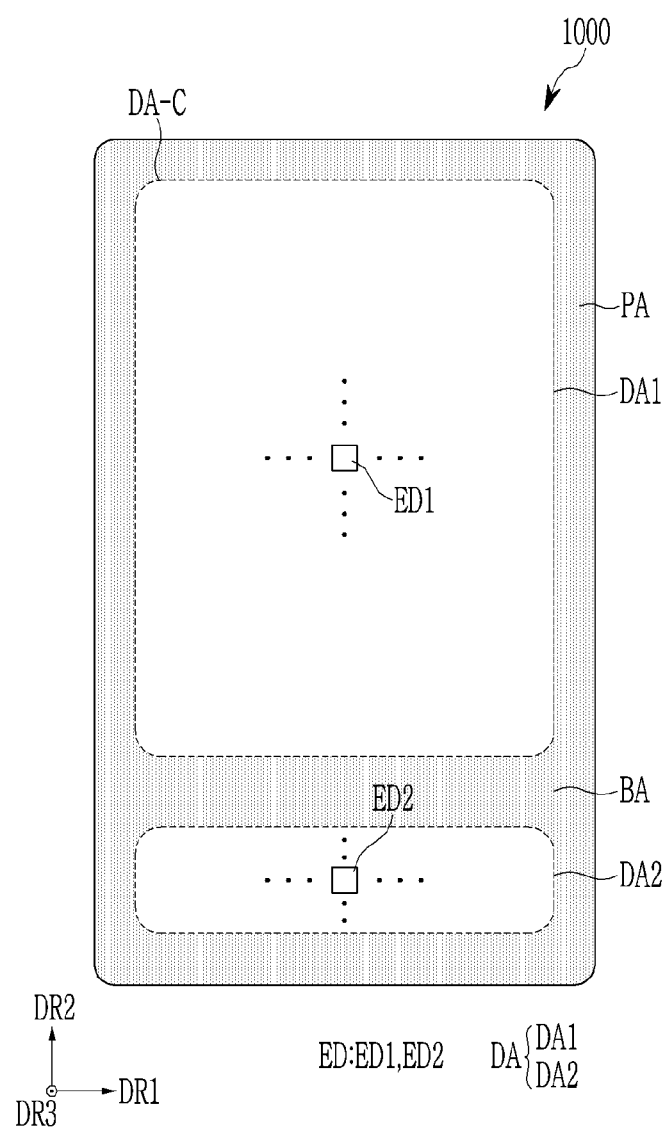
FIG. 5A is a schematic plan view of a display device according to an embodiment.
Figure 5B:
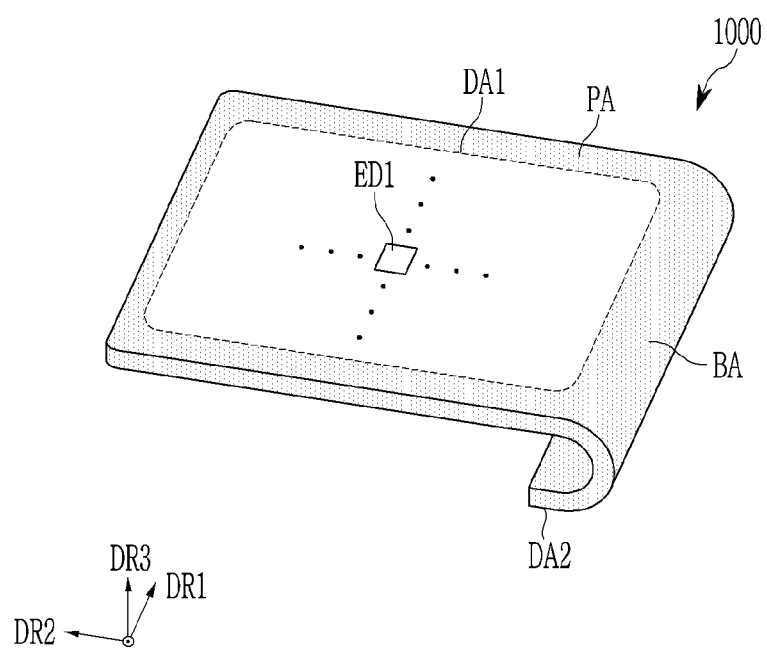
FIG. 5B is a schematic perspective view of a display device according to an embodiment.
Figure 6A:
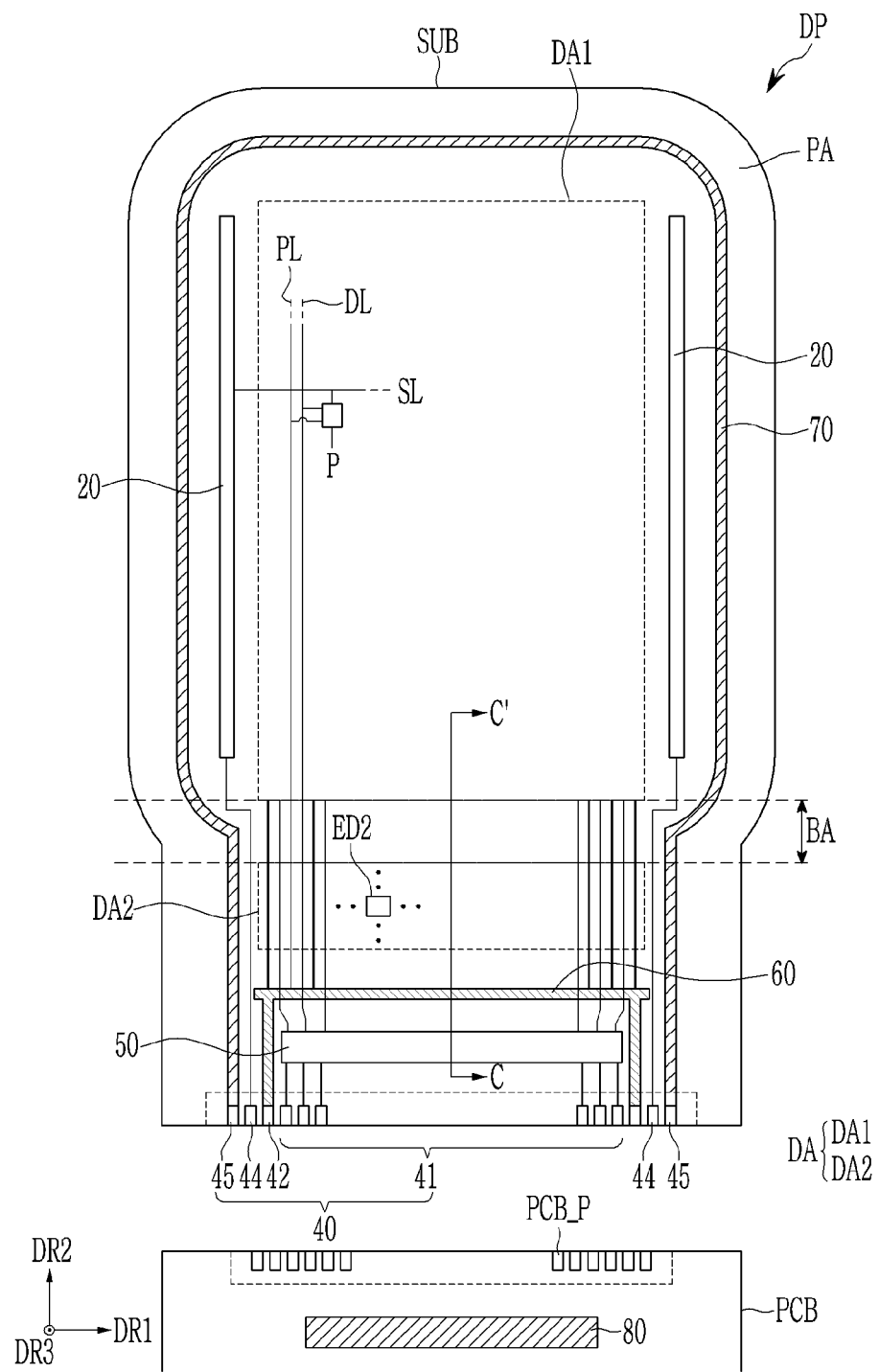
FIG. 6A is a schematic plan view of a display panel according to an embodiment.
Figure 6B:
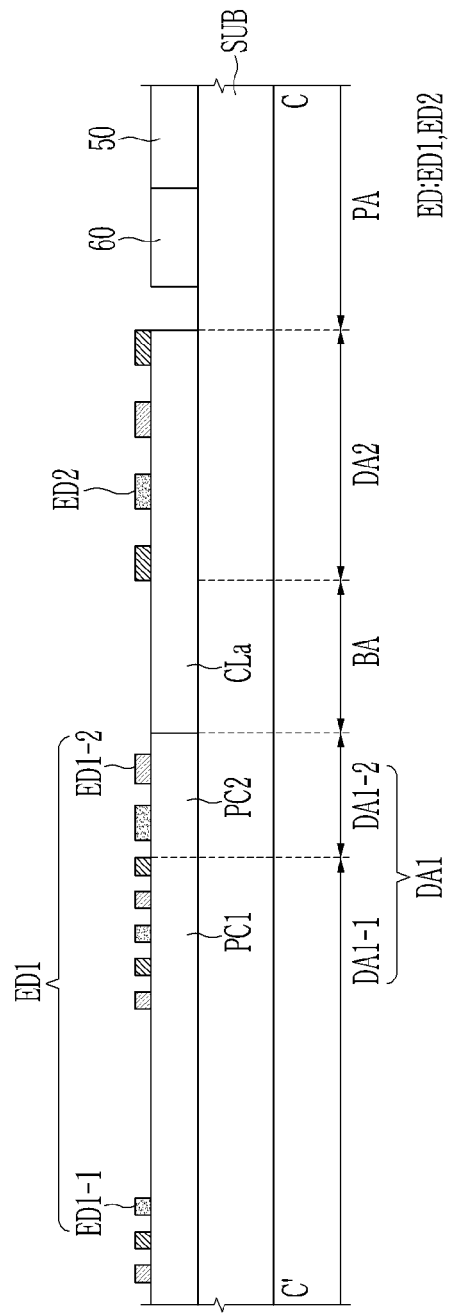
FIG. 6B is a schematic cross-sectional view taken along a line C-C' of FIG. 6A.

The display device according to an embodiment is described with reference to FIGS. 5A to 6B. According to an embodiment, FIG. 5A is a schematic plan view of a display device according to an embodiment, FIG. 5B is a schematic perspective view of a display device according to an embodiment, FIG. 6A is a schematic plan view of a display panel according to an embodiment, and FIG. 6B is a schematic cross-sectional view taken along line C-C' of FIG. 6A. Descriptions of elements substantially identical or similar to the above-described elements may be omitted. Since the cross-sectional structure of each area is substantially identical or similar to that described above, the description thereof is omitted.

Referring to FIG. 5A, the display device 1000 according to an embodiment may include a first display area DA1 and a second display area DA2. In case that the display device 1000 is unfolded, the first display area DA1 and the second display area DA2 may be arranged in the second direction DR2.

The display device 1000, as shown in FIG. 5B, may be out-folded based on the bending axis parallel to the first direction DR1. The display device 1000 may be exposed to the outside on both the first display area DA1 and the second display area DA2. The second display area DA2 may be positioned on the rear surface of the first display area DA1. The display device 1000 may display the images on both the front and rear surfaces.

Referring to FIG. 6A, the display panel DP according to an embodiment may include the first display area DA1 and the second display area DA2 disposed in the second direction DR2. The bending area BA may be positioned between the first display area DA1 and the second display area DA2. The first display area DA1, the second display area DA2, the driving voltage supply line 60, and the data driver 50 may be positioned in the second direction DR2.

Referring to FIG. 6B, the first display area DA1 may include the 1-1-th display area DA1-1 where the 1-1-th light-emitting element ED1-1 is disposed and the 1-2-th display area DA1-2 where the 1-2-th light-emitting element ED1-2 is positioned. The 1-1-th light-emitting element ED1-1 may be electrically connected to the first pixel circuit part PC1. The 1-2-th light-emitting element ED1-2 may be electrically connected to the second pixel circuit part PC2.

The second light-emitting element ED2 electrically connected to the second pixel circuit part PC2 may be positioned in the second display area DA2. Since the second display area DA2 is an area where only the light-emitting element is positioned without the pixel circuit part, and the position thereof may not be greatly limited. The second light-emitting element ED2 is electrically connected to the second pixel circuit part PC2 and may include the first electrode, the emission layer, and the second electrode crossing the bending area BA.

In the bending area BA and the second display area DA2, a data voltage transmitting wire CLa electrically connecting the data driver 50 and the data line DL and a driving voltage transmitting wire CLa electrically connecting the driving voltage supply line 60 and the driving voltage line PL may be positioned on the substrate SUB. The second light-emitting element ED2 may overlap the data voltage transmitting wiring and the driving voltage transmitting wiring CLa. The data voltage transmitting wiring and the driving voltage transmitting wiring CLa may be wires stacked under the first electrode E1. Therefore, in the second display area DA2, the second light-emitting element ED2 may be positioned on the data voltage transmitting wiring and the driving voltage transmitting wiring CLa.

In the display device according to embodiments of FIGS. 6A and 6B, the non-display area PA occupying the largest area is positioned outside the second display area DA2. Based on the bending area BA, the second display area DA2 and the non-display area PA are positioned on the rear surface of the first display area DA1. According to an embodiment, it may be possible to provide the display area in the rear surface while minimizing the area of the non-display area PA in the front where the first display area DA1 is positioned.

Figure 7A:
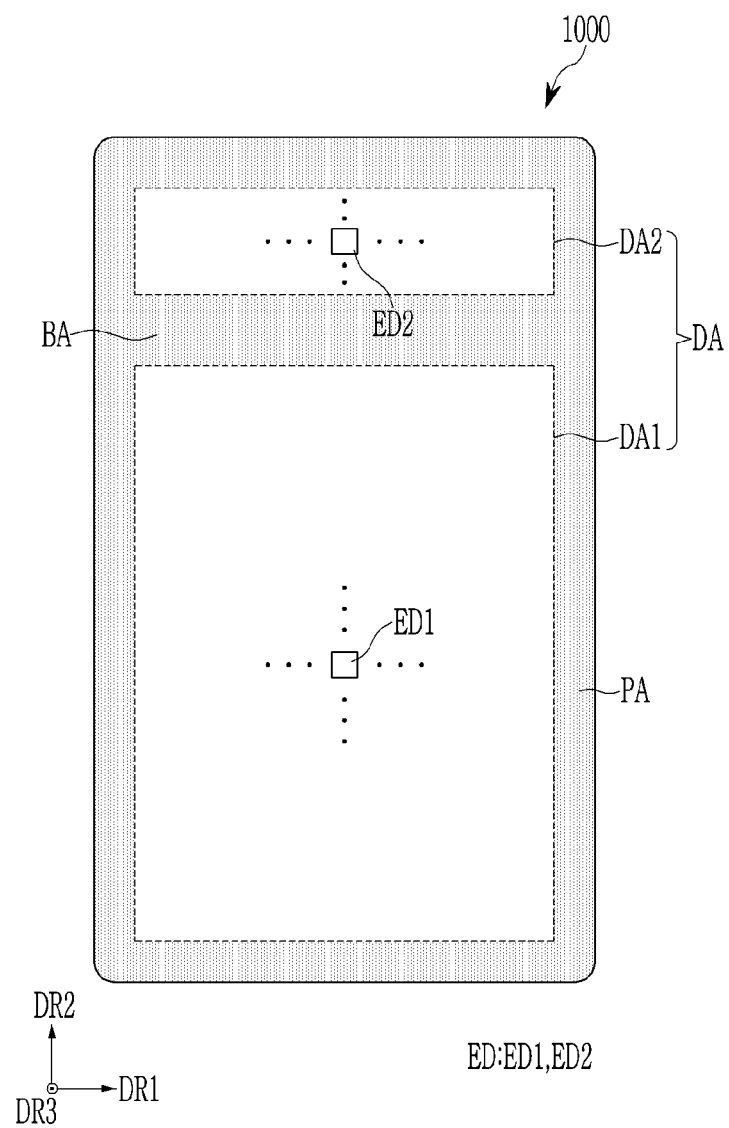
FIG. 7A is a schematic plan view of a display device according to an embodiment.
Figure 7B:
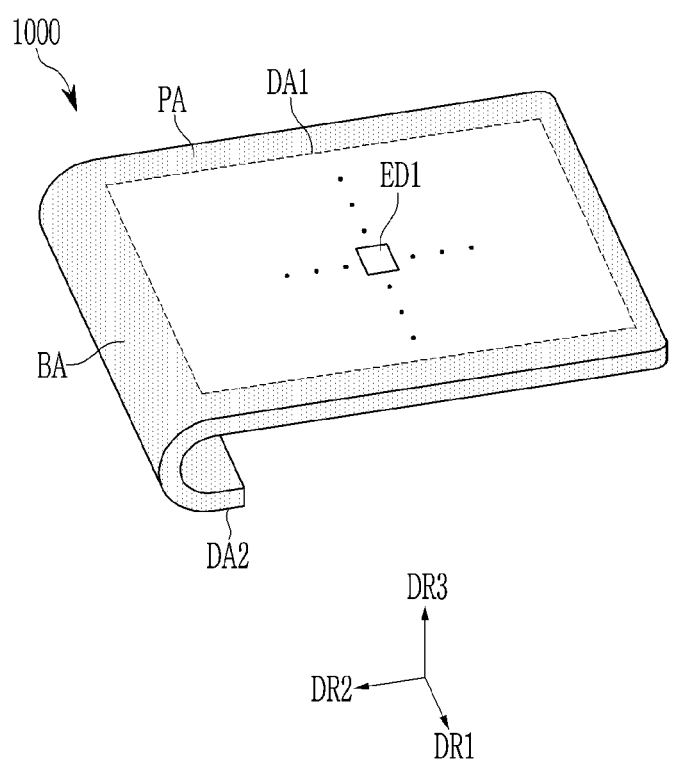
FIG. 7B is a schematic perspective view of a display device according to an embodiment.
Figure 8A:
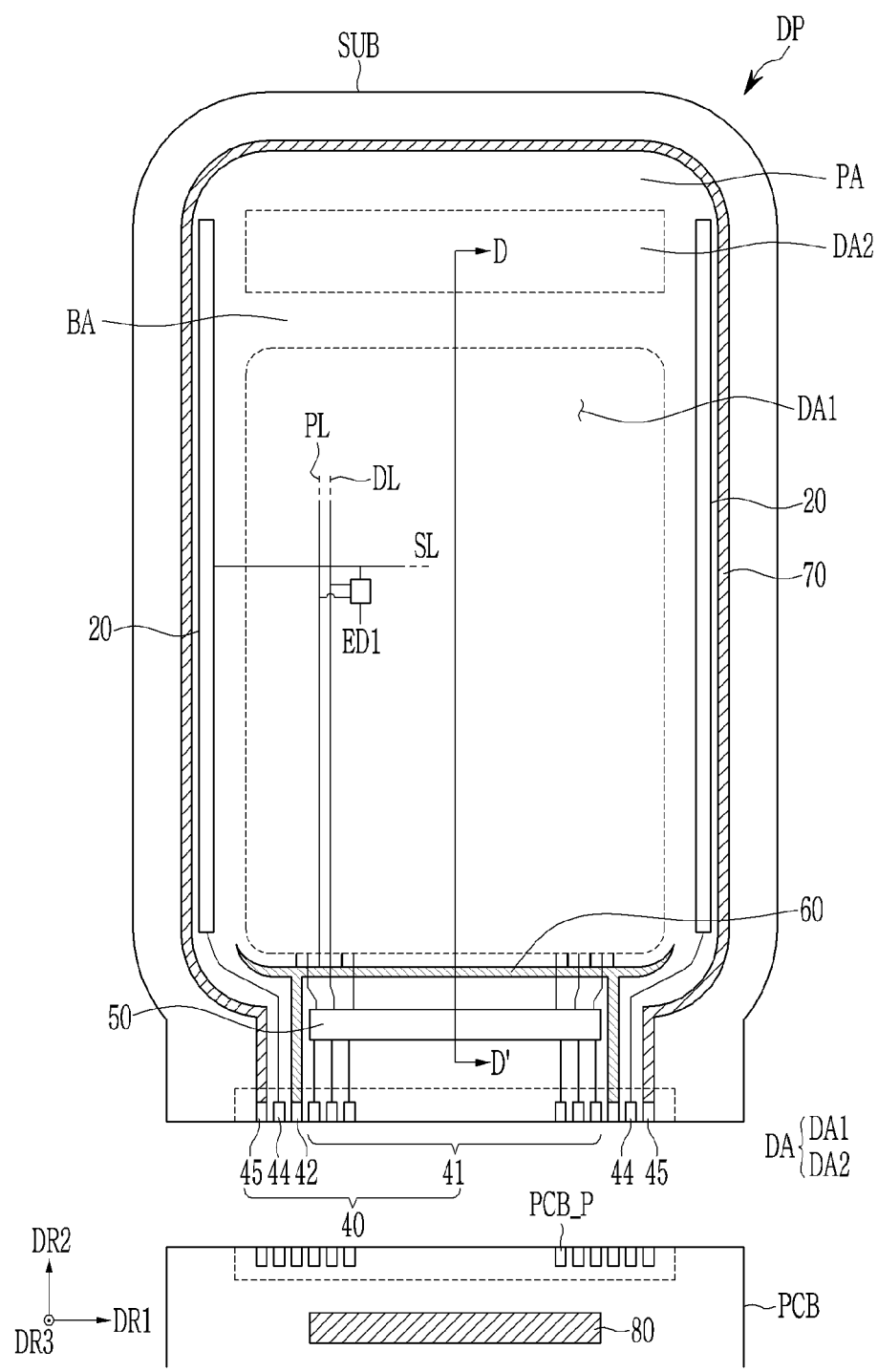
FIG. 8A is a schematic plan view of a display panel according to an embodiment.

The display device according to an embodiment is described with reference to FIGS. 7A to 8B. FIG. 7A is a schematic plan view of a display device according to an embodiment, FIG. 7B is a schematic perspective view of a display device according to an embodiment, FIG. 8A is a schematic plan view of a display panel according to an embodiment, and FIG. 8B is a schematic cross-sectional view taken along line D-D' of FIG. 8A. Descriptions of elements substantially identical or similar to the above-described constituent elements may be omitted. Since the cross-sectional structure of each area is substantially identical or similar to that described above, the description thereof is omitted.

Referring to FIG. 7A, the display device 1000 according to an embodiment may include the first display area DA1 and the second display area DA2. In case that the display device 1000 is unfolded, the first display area DA1 and the second display area DA2 may be arranged in the second direction DR2. The second display area DA2 may be positioned above the first display area DA1.

As shown in FIG. 7B, the display device 1000 may be out-folded based on a bending axis parallel to first direction DR1. Both the first display area DA1 and the second display area DA2 of the display device 1000 may be exposed to the outside. The second display area DA2 may be positioned on the rear surface of the first display area DA1. In particular, the second display area DA2 may be positioned on the upper rear surface of the first display area DA1. The display device 1000 may display the images on both the front and rear surfaces.

Referring to FIG. 8A, the display panel DP according to an embodiment may include the second display area DA2, the first display area DA1, and the data driver 50 disposed in the second direction DR2. The bending area BA may be positioned between the first display area DA1 and the second display area DA2. The data driver 50 and the printed circuit board PCB positioned under the first display area DA1 may be bent to be positioned on the rear surface of the substrate SUB. As the second display area DA2 is positioned above the first display area DA1, an area of the lower area of the first display area DA1 may be prevented from excessively increasing.

Referring to FIG. 8B, the first display area DA1 may include the 1-1-th display area DA1-1 where the 1-1-th light-emitting element ED1-1 is disposed and the 1-2-th display area DA1-2 where the 1-2-th light-emitting element ED1-2 is positioned. The 1-1-th light-emitting element ED1-1 may be electrically connected to the first pixel circuit part PC1. The 1-2-th light-emitting element ED1-2 may be electrically connected to the second pixel circuit part PC2.

In the second display area DA2, the second light-emitting element ED2 electrically connected to the second pixel circuit part PC2 may be disposed. Since the second display area DA2 is an area where only the light-emitting element is positioned without the pixel circuit part, the position thereof may not be greatly limited. The second light-emitting element ED2 is electrically connected to the second pixel circuit part PC2 and may include the first electrode, the emission layer, and the second electrode crossing the bending area BA.

According to an embodiment, the display device may include the second display area other than the first display area. The second display area may be an area where only the light-emitting element is positioned as it is electrically connected to the pixel circuit part positioned on the first display area. The second display area may be positioned on the rear of the first display area as the substrate is bent. The display device may display the images on the front and rear. Even when displaying the image from the front and rear, the transistor for displaying the image on the rear is positioned in the first display area, so that the thickness of the display device does not need to be increased, and an additional IC chip arrangement may not be required. The substrate may be readily bent by removing the encapsulation layer positioned in the bending area.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising:
    a substrate including:
        a first display area,
        a second display area; and
        a non-display area;
    a first pixel circuit part and a second pixel circuit part disposed in the first display area;
    a 1-1-th light-emitting element electrically connected to the first pixel circuit part and overlapping the first display area; and
    a second light-emitting element electrically connected to the second pixel circuit part and overlapping the second display area, wherein
    the non-display area is disposed between the first display area and the second display area,
    the first display area includes a 1-1-th display area and a 1-2-th display area including at least two separate side portions,
    the display device includes a scan driver overlapping at least a part of the 1-2-th display area at the two separate side portions,
    the display device includes a 1-2-th light-emitting element disposed in the 1-2-th display area, and
    the 1-2-th light-emitting element is electrically connected to the second pixel circuit part and disposed on the scan driver.

2. The display device of claim 1, wherein the non-display area between the first display area and the second display area is a bending area.

3. The display device of claim 1, wherein the first pixel circuit part and the 1-1-th light-emitting element are disposed in the 1-1-th display area.

4. The display device of claim 3, wherein
    the 1-1-th light-emitting element is electrically connected to the first pixel circuit part.

5. The display device of claim 2, wherein
    the second light-emitting element includes:
        a first electrode;
        an emission layer disposed on the first electrode; and
        a second electrode disposed on the emission layer,
    the first electrode is electrically connected to the second pixel circuit part, and
    the first electrode is bent in the bending area.

6. The display device of claim 5, wherein
    the display device includes:
        a first encapsulation layer disposed on the 1-1-th light-emitting element; and
        a second encapsulation layer disposed on the second light-emitting element, and
    the first encapsulation layer and the second encapsulation layer are spaced apart.

7. The display device of claim 1, wherein
    the display device includes a scan line extending in a first direction, and
    the first display area and the second display area are spaced apart in the first direction.

8. The display device of claim 1, wherein
    the display device includes a data line extending in a second direction, and
    the first display area and the second display area are spaced apart in the second direction.

9. The display device of claim 8, wherein
    the display device includes a data driver disposed in the non-display area, and
    the first display area, the second display area, and the data driver are disposed in the second direction.

10. The display device of claim 8, wherein
    the display device includes a data driver disposed in the non-display area, and
    the second display area, the first display area, and the data driver are disposed in the second direction.

11. The display device of claim 1, wherein
    the first display area is disposed on a front of the display device, and
    the second display area is disposed on a rear of the display device.

12. A display device comprising:
    a substrate including:
        a first display area;
        a second display area; and
        a bending area between the first display area and the second display area,
    a first pixel circuit part and a second pixel circuit part disposed in the first display area;
    a 1-1-th light-emitting element electrically connected to the first pixel circuit part and overlapping the first display area; and
    a second light-emitting element electrically connected to the second pixel circuit part and overlapping the second display area, wherein
    the first display area is disposed on a front of the display device,
    the second display area is disposed on a rear of the display device, the first display area includes a 1-1-th display area and a 1-2-th display area including at least two separate side portions, the display device includes a scan driver overlapping at least a part of the 1-2-th display area at the two separate side portions, the display device includes a 1-2-th light-emitting element disposed in the 1-2-th display area and the 1-2-th light-emitting element is electrically connected to the second pixel circuit part and disposed on the scan driver.

13. The display device of claim 12, wherein
the 1-1-th light-emitting element is disposed in the 1-1-th display area.

14. The display device of claim 13, wherein the 1-2-th light-emitting element overlaps the second pixel circuit part.

15. The display device of claim 12, wherein
the second light-emitting element includes:
a first electrode;
an emission layer overlapping the first electrode; and
a second electrode overlapping the emission layer, and the first electrode is electrically connected to the second pixel circuit part and intersects the bending area.

16. The display device of claim 12, wherein
the display device includes:
a first encapsulation layer overlapping the 1-1-th light-emitting element; and
a second encapsulation layer overlapping the second light-emitting element, and
the first encapsulation layer and the second encapsulation layer are spaced apart.

17. The display device of claim 12, wherein
the display device includes a scan line extending in a first direction, and
the first display area and the second display area are spaced apart in the first direction.

18. The display device of claim 12, wherein
the display device includes a data line extending in a second direction, and
the first display area and the second display area are spaced apart in the second direction.

* * * * *